US008449677B2

(12) United States Patent
Braillard et al.

(10) Patent No.: US 8,449,677 B2
(45) Date of Patent: May 28, 2013

(54) METHOD OF DEPOSITING A THERMAL BARRIER BY PLASMA TORCH

(75) Inventors: Frederic Braillard, Chatellerault (FR); Justine Menuey, Chatellerault (FR); Elise Nogues, Limoges (FR); Aurelien Tricoire, Limoges (FR); Michel Vardelle, Saint-Just le Matel (FR)

(73) Assignee: SNECMA, Paris (FR)

( * ) Notice: Subject to any disclaimer, the term of this patent is extended or adjusted under 35 U.S.C. 154(b) by 0 days.

(21) Appl. No.: 12/816,951

(22) Filed: Jun. 16, 2010

(65) Prior Publication Data

US 2010/0252539 A1 Oct. 7, 2010

Related U.S. Application Data

(62) Division of application No. 11/676,834, filed on Feb. 20, 2007, now Pat. No. 7,763,328.

(30) Foreign Application Priority Data

Feb. 20, 2006 (FR) ..................................... 06 50590

(51) Int. Cl.
*C23C 16/00* (2006.01)

(52) U.S. Cl.
USPC .................................... 118/715; 118/723 FE

(58) Field of Classification Search
USPC ........................................... 118/715, 723 FE
See application file for complete search history.

(56) References Cited

U.S. PATENT DOCUMENTS

| | | | | |
|---|---|---|---|---|
| 3,714,390 | A | 1/1973 | Foex et al. | |
| 3,912,235 | A | 10/1975 | Janssen et al. | |
| 3,953,704 | A * | 4/1976 | Bejat et al. | 219/76.16 |
| 3,997,468 | A | 12/1976 | Maljushevsky et al. | |
| 4,681,772 | A * | 7/1987 | Rairden, III | 427/448 |
| 4,683,148 | A * | 7/1987 | Rairden, III | 427/448 |
| 4,818,837 | A | 4/1989 | Pfender | |
| 4,943,345 | A * | 7/1990 | Asmussen et al. | 216/69 |
| 5,047,612 | A * | 9/1991 | Savkar et al. | 219/121.47 |
| 5,144,110 | A * | 9/1992 | Marantz et al. | 219/121.48 |
| 5,837,959 | A * | 11/1998 | Muehlberger et al. | 219/121.47 |
| 5,853,815 | A * | 12/1998 | Muehlberger | 427/446 |
| 5,952,056 | A * | 9/1999 | Jordan et al. | 427/455 |
| 6,050,215 | A * | 4/2000 | Koulik et al. | 118/723 R |
| 6,997,371 | B2 * | 2/2006 | Shabtay | 228/183 |
| 7,557,324 | B2 * | 7/2009 | Nylen et al. | 219/121.47 |
| 2001/0041227 | A1 * | 11/2001 | Hislop | 427/446 |
| 2002/0030038 | A1 * | 3/2002 | Bollinger et al. | 219/121.54 |
| 2004/0234687 | A1 * | 11/2004 | Schmid et al. | 427/248.1 |

* cited by examiner

*Primary Examiner* — Keath Chen
(74) *Attorney, Agent, or Firm* — Oblon, Spivak, McClelland, Maier & Neustadt, L.L.P.

(57) ABSTRACT

The invention relates to the field of methods of depositing a material on a substrate. It relates to a method of depositing, onto a substrate, a material that acts as a thermal barrier and that prior to deposition is in powder form. The powder is introduced into the plasma jet of a first plasma torch and into the plasma jet of at least one second plasma torch, the first plasma torch and at least the second plasma torch being disposed in an enclosure and oriented in such a manner that their plasma jets cross, so as to create a resultant plasma jet in which the powder is vaporized, the substrate being placed on the axis of the resultant plasma jet.

12 Claims, 1 Drawing Sheet

METHOD OF DEPOSITING A THERMAL BARRIER BY PLASMA TORCH

CROSS-REFERENCE TO RELATED APPLICATION

The present application is a Divisional of U.S. Ser. No. 11/676,834 filed Feb. 20, 2007, which is hereby incorporated herein by reference in its entirety, and U.S. Ser. No. 11/676,834 claims the benefit from French Patent Application No. 0650590, filed Feb. 20, 2006.

BACKGROUND OF THE INVENTION

1. Field of the Art

The present invention relates to a method of depositing, onto a substrate, a material that acts as a thermal barrier, the material being in powder form prior to deposition.

2. Prior Art

By way of example, the substrate may be a superalloy, in particular a superalloy for constituting turbomachine parts.

The two technologies that are used industrially for depositing, onto a substrate, a material that acts as a thermal barrier, typically a ceramic, are plasma spraying, and vapor phase deposition.

Plasma spraying consists in injecting the material for deposition in powder form into the plasma jet of a plasma torch. The plasma jet is generated by creating an electric arc between the anode and the cathode of a plasma torch, thereby ionizing the gaseous mixture blown through said arc by the plasma torch. The size of the powder particles injected into the jet lies typically in the range 1 micrometer (μm) to 50 μm. The plasma jet, which reaches a temperature of 20,000 K and a speed of the order of 400 meters per second (m/s) to 1000 m/s entrains and melts the powder particles. They then strike the substrate in the form of droplets which, on impact, solidify in a flattened shape.

Vapor phase deposition generally makes use of an electron beam for vaporizing the material that is to be deposited. The most widespread technique is electron beam physical vapor deposition (EBPVD). Once the material has been vaporized by the electron beam, it condenses on the substrate. Because a beam of electrons is used, it is necessary to maintain a secondary vacuum inside the enclosure that contains the electron beam, the material to be deposited, and the substrate.

Other technologies exist, but they are not yet at an industrial stage. Electron beam directed vapor deposition (EB-DVD) is based on the same principle as EBPVD. Thermal plasma physical vapor deposition (TPPVD) uses a plasma torch as a source of heat to evaporate the material that is to be deposited. The torch is coupled to a radiofrequency source for increased efficiency. The technical obstacle posed by that method is keeping the powder of the material for deposition in the plasma for a length of time that is long enough for it to vaporize.

Each of the two technologies used industrially for depositing, onto a substrate, a material that acts as a thermal barrier possesses advantages and drawbacks:

The deposit that results from plasma spraying presents lamellar morphology, the superposed lamellae being parallel to the surface of the substrate. The deposit possesses microcracks that are due to the quenching of the droplets while they are being subjected to impact on the substrate, so the deposit is porous. Because of its structure and its porosity, the deposit thus has the advantage of possessing low thermal conductivity. The substrate is thus better protected thermally. However, that type of deposit presents limited lifetime since thermal expansions of the substrate tend to fracture the deposit and cause it to spall. It is also difficult with that method to obtain a deposit of uniform thickness on parts that are complex in shape, since the method is highly directional.

The deposit that results from electron beam vapor phase techniques presents columnar morphology, the columns being arranged beside one another perpendicularly to the surface of the substrate. The deposit thus presents good lifetime, firstly because its structure accommodates thermal expansion of the substrate well, and secondly because its resistance to erosion is much greater than that of a plasma deposit. However, the deposit possesses thermal conductivity that is higher than that of a deposit obtained by plasma spraying, which is undesirable since the deposit then constitutes a thermal barrier that is less effective. In addition, deposition rate and yield are low. The low yield is due to the fact that the method creates a "cloud" of vapor, which therefore condenses in indiscriminant manner, including on the walls. Above all, electron beam deposition is a technique that is expensive and difficult, since it requires high levels of electrical power for the electron guns and to obtain a high vacuum in enclosures of large volume.

OBJECT AND SUMMARY OF THE INVENTION

The present invention seeks to remedy those drawbacks, or at least to attenuate them.

The invention provides a method making it possible firstly to obtain a deposit that combines the technical advantages of a lamellar deposit and of a columnar deposit, i.e. low thermal conductivity, good lifetime, good resistance to erosion, and high yield and deposition rates, and secondly presenting a cost of implementation that is lower than that of the vacuum is phase deposition method.

This object is achieved by the fact that the powder is introduced into the plasma jet of a first plasma torch and into the plasma jet of at least one second plasma torch, the first plasma torch and at least the second plasma torch being disposed in an enclosure and oriented in such a manner that their plasma jets cross so as to create a resultant plasma jet in which said powder is vaporized, said substrate being placed on the axis of said resultant plasma jet.

By using two plasma torches, the quantity of energy received by the particles of powder is increased, thereby encouraging the particles to evaporate. Furthermore, when the plasma jets meet, the largest powder particles that have not vaporized continue their trajectories on the axes of the respective jets, while the vaporized powder is entrained by the flow of gas in the plasma jet that results from combining the plasma jets from each of the torches. This results in non-vaporized powder particles being separated from the vapor of the material. Thus, when the substrate is placed on the axis of the resulting plasma jet, it is impacted by material in the vapor phase, thus encouraging the material to become deposited on the substrate in columnar form.

Also, because the resultant jet is directional, deposition rate and yield are higher than when using the electron beam vapor phase deposition technique.

In addition, it is not necessary to establish a vacuum in the enclosure containing the torches and the substrate, and the power required for operating the plasma torches is less than that required for an electron beam. The cost of implementing the present method is thus lower than that of present vapor phase deposition technologies.

In addition, by modifying the parameters of the plasma torch, it is possible to reduce the proportion of powder particles that are evaporated, thereby encouraging deposition on the substrate in lamellar form. Overall, it is thus possible by the present method to obtain a deposit of hybrid structure, simultaneously combining deposition in columnar form and in lamellar form. This hybrid deposit possesses low thermal conductivity, good lifetime, and good resistance to erosion, thus combining the advantages of column structures and of lamellar structures.

By way of example, only two plasma torches need be used.

Advantageously, the pressure inside the enclosure is reduced.

By creating a fairly low level of pressure reduction (primary vacuum) in the enclosure, the plasma is less dense, thus enabling fine particles of the material powder to penetrate more easily into the plasma jet and thus be heated better. Pressure reduction also makes it possible to reduce the saturated vapor pressure of the material, and thus encourages its evaporation.

Advantageously, the axes of the torches constitute generator lines of a cone of central axis z, the axis of each of the torches forming, relative to the central axis z of the cone, an angle α lying in the range 20° to 60°, the central axis z of the cone being directed towards the surface of the substrate that is to receive the material to be deposited.

By means of this configuration, all the plasma jets cross at the same point, and the orientation of the torches relative to one another is optimized so as to obtain a plasma jet in which the powder particles are vaporized. If the angles between the axes of the torches and the central axis z of the cone are too small, then the larger, non-vaporized particles will be entrained by the jet. If the angles between the axes of the torches and the central axis z of the cone are too great, then the resultant plasma jet that is generated is insufficient.

Advantageously, the distance D between each of the torches and the substrate lies in the range 50 millimeters (mm) to 500 mm.

By means of this configuration, deposition of the vaporized powder on the substrate is optimized.

Advantageously, the material is a ceramic.

For example, the ceramic is selected from a group comprising yttrium zirconia, and zirconia possibly stabilized with at least one of the oxides selected from the following list: CaO, MgO, $CeO_2$, and rare earth oxides.

Advantageously, the substrate may include on its surface a bonding underlayer onto which the material that acts as a thermal barrier is deposited by the method in accordance with the invention.

Because of the presence of this underlayer, the deposited material adheres better to the substrate. The underlayer may also contribute to performing the thermal barrier role together with the deposited material.

Advantageously, the material introduced in powder form into each of the torches differs from one torch to another.

The invention also relates to an installation for depositing, onto a substrate, a material that acts as a thermal barrier, the material prior to deposition being in powder form.

According to the invention, the installation comprises an enclosure having said substrate disposed therein, a first plasma torch, and at least one second plasma torch disposed in said enclosure in such a manner that when said powder is introduced into the plasma jet of said first plasma torch and into the plasma jet of at least said second plasma torch, the plasma jet of said first plasma torch and the plasma jet of said second plasma torch cross, thereby creating a resultant plasma jet in which said powder is vaporized, said substrate being placed on the axis of said resultant plasma jet.

The installation also comprises a support suitable for receiving the substrate, and supports for receiving each of the plasma torches, the supports being adjustable in such a manner as to enable the torches to be oriented in any manner.

Advantageously, the inside diameter of each torch is greater than 6 mm.

By means of this disposition, the density of the plasma at the outlet from the nozzles is smaller, and thus the length of time spent by the particles within the plasma is longer. The powder particles are thus better vaporized.

The invention also provides a thermomechanical part obtained by depositing, onto a substrate, a material that acts as a thermal barrier, by using the method in accordance with the invention as presented above.

BRIEF DESCRIPTION OF THE DRAWING

The invention can be better understood and its advantages appear better on reading the following detailed description of an embodiment by way of non-limiting example. The description refers to the accompanying drawing, in which.

MORE DETAILED DESCRIPTION

Figure 1:
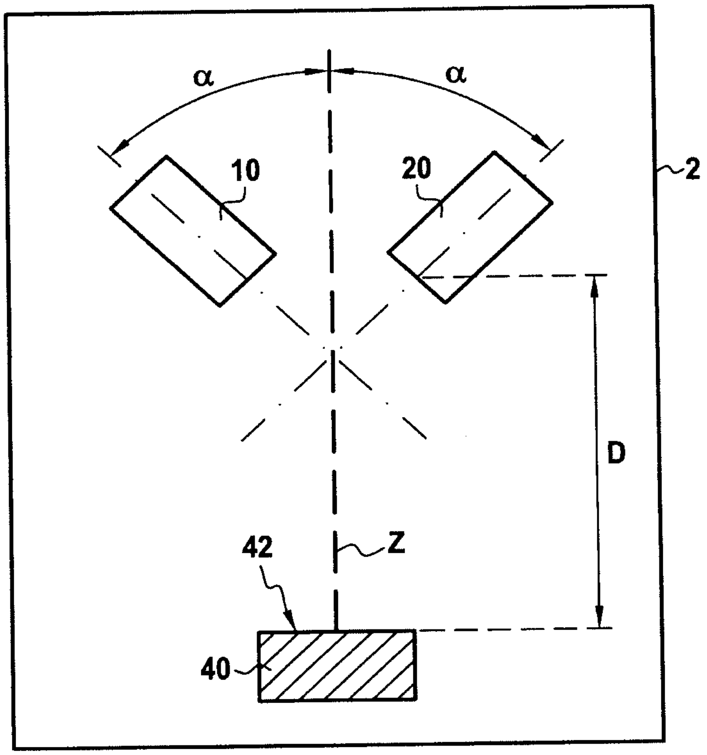
FIG. 1 is an overall view of an installation enabling the method of the invention to be implemented.

As shown in FIG. 1, an enclosure 2 has a first plasma torch 10, a second plasma torch 20, and a substrate 40. Each of the first and second plasma torches presents an angle α relative to an axis z directed towards the surface of the substrate that is to receive the deposit (in the example shown, the axis z is perpendicular to the surface of the substrate 40). For reasons of symmetry, the angle α is identical for the first and second plasma torches 10, 20. Nevertheless, the angle α could be different for each of the torches. Ideally, the angle α lies in the range 20° to 60°. The end of each torch from which the plasma jet exits is situated at a distance D from the surface 42 of the substrate 40 that is to receive the deposit, the distance D being measured parallel to the axis z. For reasons of symmetry, the distance D is identical for the first and second plasma torches 10 and 20. Nevertheless, this distance could be different for each of the torches. Ideally, the distance D between each of the torches 10, 20 and the substrate 20 lies in the range 50 mm to 500 mm.

Figure 2:
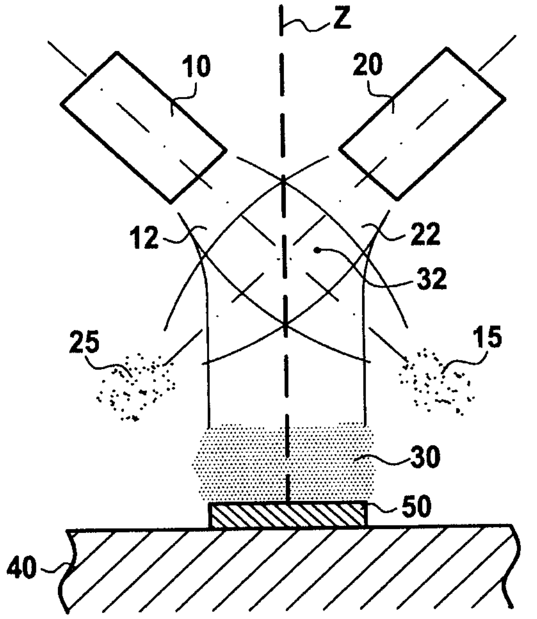
FIG. 2 is a view showing plasma jets crossing, together with the resulting plasma.

FIG. 2 shows more precisely the deposition method of the invention. The first plasma torch 10 and the second plasma torch 20 operate in conventional manner, without induction. This operation is therefore not described in greater detail, and only the general outline is recalled below. A gaseous mixture is expelled from each plasma torch 10, 20 through an electric arc between the anode and the cathode of the plasma torch. The gaseous mixture is thus ionized and ejected at high speed (typically lying in the range 500 m/s to 2000 m/s), and at high temperature (typically greater than 10,000 K), forming a plasma jet 12, 22.

The material that is to be deposited on the substrate is introduced into each of the plasma jets in powder form at the end of the plasma torch from which the plasma jet is ejected. The size of the particles constituting the powder typically lies in the range 1 μm to 100 μm.

The powder particles introduced into the plasma jet 12 of the first plasma torch 10 and those introduced into the plasma jet 22 of the second plasma torch 20 are heated by each of the jets on being introduced into the jet. They are entrained to a crossing zone 32 where the first plasma jet 12 and the second plasma jet 22 cross. In this crossing zone 32, the quantity of energy received by the particles of powder is increased, thereby encouraging said particles to evaporate. The largest powder particles 15 of the first plasma jet, and the largest powder particles 25 of the second plasma jet, particles that are not vaporized, continue to follow their trajectories on the axes of the respective jets (the axes of the torches), while the powder that is vaporized is entrained by the flow of gas in the resulting plasma jet 30 formed by combining the first and second plasma jets 12 and 22. This thus separates non-vaporized powder particles from the vapor material. On becoming deposited on the substrate 40, the vapor material transported by the resulting plasma jet 30 forms a deposit 50 of essentially columnar morphology.

Since a plasma torch typically operates at ambient pressure, there is no need to evacuate the enclosure 2 containing the plasma torches 10, 20 and the substrate 40. The cost of implementing the present method, which enables material in the vapor phase to be deposited on a substrate, is thus much lower than that of present vapor deposition technologies. In order to improve deposition, it is nevertheless possible to establish a primary vacuum in the enclosure 2. However, unlike present vapor deposition technologies, there is no need to establish a secondary vacuum inside the enclosure, so the cost of implementing the present method is smaller.

Typically, the diameter of a plasma torch is 6 mm. In order to improve the evaporation process, it is possible to use torches of greater diameters.

The material for deposition on the substrate 40 is typically a ceramic, since the thermal barriers that possess the best properties are obtained with ceramics. Typically, the ceramics used are yttrium zirconias, in particular an yttrium zirconia including 4% to 20% by weight of yttrium oxide. Other ceramics can be used, such as for example zirconia optionally stabilized with at least one of the oxides selected from the following list: CaO, MgO, $CeO_2$, and rare earth oxides, specifically the oxides of scandium, lanthanum, cerium, praseodymium, neodymium, promethium, samarium, europium, gadolinium, terbium, dysprosium, holmium, erbium, thulium, ytterbium, and lutetium.

At its surface, the substrate 40 may have a bonding underlayer on which the material acting as a thermal barrier is deposited in order to form the deposit 50. The underlayer can achieve better adhesion between the substrate 40 and the deposited material forming the deposit 50, and it also acts as an additional thermal barrier. For example, the underlayer may be an alumina-forming alloy that withstands oxidation-corrosion, such as an alloy suitable for forming a layer of protective alumina by oxidation, an alloy of the MCrAlY type, where M is a metal selected from nickel, chromium, iron, and cobalt.

It is also possible to introduce different materials into each of the plasma torches 10, 20 so as to obtain on the substrate 40 a deposit 50 having a composition that is different from that of each of the materials introduced into the plasma torches 10, 20. The rate at which powder is introduced into each of the torches 10, 20 can be the same or can differ from one torch to the other. Furthermore, the rate at which powder is introduced into each of the torches 10, 20 may be constant over time or may be variable over time.

The method of depositing a material acting as a thermal barrier on a substrate is described above in the context of using two plasma torches. Nevertheless, a larger number of torches could be used for deposition purposes.

What is claimed is:

1. An installation for depositing, onto a substrate, a material acting as a thermal barrier, said material being in powder form prior to deposition, the installation comprising:

an enclosure having said substrate disposed therein, a first plasma torch, which includes a first anode and a first cathode, and at least one second plasma torch, which includes a second anode and a second cathode, and is disposed in said enclosure in such a manner that when said powder is introduced into the first plasma jet of said first plasma torch at the end of said first plasma torch from which said first plasma jet is ejected and into the second plasma jet of at least said second plasma torch at the end of said second plasma torch from which said second plasma jet is ejected, the first plasma jet of said first plasma torch and the second plasma jet of said second plasma torch cross at an intersection, such that particles of the powder in the first and second plasma jets that do not vaporize at the intersection continue moving through the intersection along respective trajectories of the first and second plasma jets and do not collide with said substrate while moving along the respective trajectories, thereby creating a resultant plasma jet in which said powder is vaporized, said substrate being placed on the axis of said resultant plasma jet.

2. An installation according to claim 1, wherein the inside diameter of each of said first and second plasma torches is greater than 6 mm.

3. An installation according to claim 1, wherein said first plasma torch presents a first angle relative to an axis z directed towards said substrate, and wherein said second plasma torch presents a second angle relative to an axis z directed towards said substrate.

4. An installation according to claim 3, wherein said first and second angles each lies in a range of 20° to 60°.

5. An installation according to claim 4, wherein said first and second angles are equal to each other.

6. An installation according to claim 4, wherein said first and second angles are different from each other.

7. An installation according to claim 3, wherein the end of said first plasma torch is situated at a first distance from said substrate, said first distance being measured parallel to the axis z, and wherein the end of said second plasma torch is situated at a second distance from said substrate, said second distance being measured parallel to the axis z.

8. An installation according to claim 7, wherein each of said first and second distances lies within a range of 50 mm to 500 mm.

9. An installation according to claim 8, wherein said first and second distances are equal to each other.

10. An installation according to claim 8, wherein said first and second distances are different from each other.

11. An installation according to claim 1, further comprising:

a first powder ejector configured to eject powder at said end of said first plasma torch, said powder ejected from said first ejector having a particle size within a range of 1 μm to 100 μm, and a second powder ejector configured to eject powder at said end of said second plasma torch, said powder ejected from said second ejector having a particle size within a range of 1 μm to 100 μm.

12. An installation according to claim 1, wherein the enclosure is maintained at ambient pressure, and the first plasma torch and at least the second plasma torch are configured to operate at the ambient pressure.

* * * * *